(12) United States Patent
Cross et al.

(10) Patent No.: US 7,239,026 B2
(45) Date of Patent: Jul. 3, 2007

(54) SEMICONDUCTOR DEVICE HAVING DIE ATTACHMENT AND DIE PAD FOR APPLYING TENSILE OR COMPRESSIVE STRESS TO THE IC CHIP

(75) Inventors: Jeffrey Scott Cross, Kawasaki (JP);
Mineharu Tsukada, Kawasaki (JP);
Yoshimasa Horii, Kawasaki (JP);
Alexei Gruverman, Raleigh, NC (US);
Angus Kingon, Raleigh, NC (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/440,068

(22) Filed: May 25, 2006

(65) Prior Publication Data

US 2006/0273365 A1 Dec. 7, 2006

Related U.S. Application Data

(62) Division of application No. 10/716,878, filed on Nov. 20, 2003, now Pat. No. 7,075,135.

(30) Foreign Application Priority Data

Nov. 21, 2002 (JP) ............................. 2002-338307

(51) Int. Cl.
*H01L 23/48* (2006.01)
*H01L 23/52* (2006.01)
*H01L 29/40* (2006.01)

(52) U.S. Cl. .................. 257/782; 257/783; 257/E23.04

(58) Field of Classification Search ................ 257/666, 257/669, 723, 753, 782, 783, E23.04, E23.057
See application file for complete search history.

(56) References Cited

U.S. PATENT DOCUMENTS

| | | | |
|---|---|---|---|
| 6,141,385 A * | 10/2000 | Yamaji | 257/690 |
| 6,348,368 B1 | 2/2002 | Yamazaki et al. | |
| 6,432,767 B2 | 8/2002 | Torii et al. | |
| 6,583,512 B2 * | 6/2003 | Nakaoka et al. | 257/777 |

* cited by examiner

*Primary Examiner*—Hoai Pham
(74) *Attorney, Agent, or Firm*—Westerman, Hattori, Daniels & Adrian, LLP.

(57) ABSTRACT

A semiconductor device comprises a substrate, a ferroelectric capacitor which includes a ferroelectric film on the substrate, and a stress application layer which applies tensile or compressive stress to the ferroelectric film of the ferroelectric capacitor by applying stress to the substrate.

3 Claims, 18 Drawing Sheets

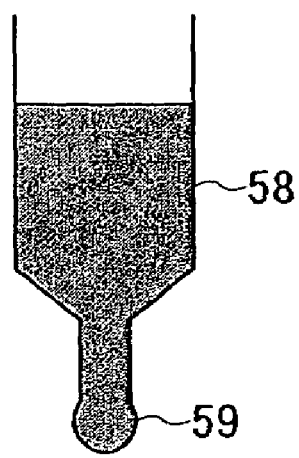
FIG.19A
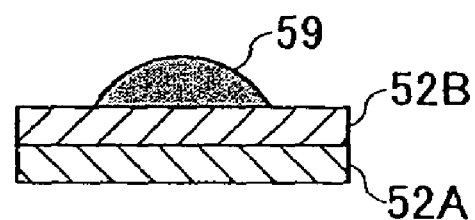
FIG.19B
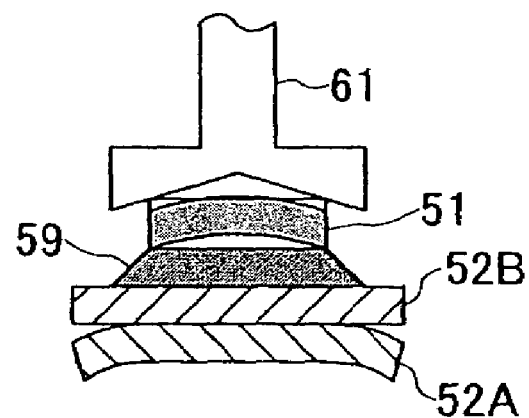
FIG.19C
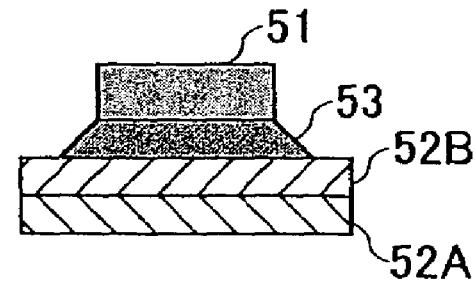

SEMICONDUCTOR DEVICE HAVING DIE ATTACHMENT AND DIE PAD FOR APPLYING TENSILE OR COMPRESSIVE STRESS TO THE IC CHIP

CROSS-REFERENCE TO RELATED APPLICATIONS

This application is a divisional of application Ser. No. 10/716,878, filed Nov. 20, 2003 now U.S. Pat. No. 7,075,135.

BACKGROUND OF THE INVENTION

1. Field of the Invention

The present invention generally relates to a semiconductor device, and more specifically relates to a FeRAM (ferroelectric random-access memory) which stores information in a ferroelectric capacitor containing a ferroelectric film. Moreover, the present invention relates to a fixture for measurement of electrical property of a ferroelectric film capacitor within a semiconductor device.

2. Description of the Related Art

In recent years, a flash memory (electrically-rewritable non-volatile memory) which supplies the information in the form of charge to the floating-gate electrode has been often used as the auxiliary memory of a personal computer or the like. On the other hand, there has been proposed a FeRAM (ferroelectric random-access memory) which stores information in a ferroelectric capacitor in the form of spontaneous polarization of the ferroelectric capacitor, instead of the floating gate electrode as in the flash memory.

In the FeRAM, the ferroelectric materials used in the ferroelectric capacitor include PZT (Pb(Zr,Ti)0$_3$), PLZT (Pb(Zr,La,Ti)0$_3$), each having the perovskite crystal structure, and bismuth layered ferroelectric substance oxide SBT (SrBi2Ta2O9) having the layered perovskite crystal structure. In the FeRAM, the spontaneous polarization of the capacitor is controlled by the electric field applied, and it has the advantages of high writing speed and low power dissipation. The FeRAM is appropriate for use in a large-scale integrated circuit.

FIG. 1 shows the composition of a memory cell in a conventional FeRAM. As shown in FIG. 1, the memory cell is arranged in the 2T2C composition, and two transfer transistors T1 and T2 and two capacitors C1 and C2 are used in order to store the 1-bit information. The memory cell carries out such complementary operation that the data "0" is stored in one of the capacitors and the data "1" is stored in the other capacitor.

Specifically, when writing information, the transfer transistors T1 and T2 are turned ON by the word line WL, and the data "0" or "1" is inputted to the bit line BL and the data "1" or "0" is inputted to the complementary bit line /BL, so that the complementary information is written in the capacitors C1 and C2 respectively. The complementary information is held in the capacitors as the direction of polarization of the ferroelectric materials of the capacitors.

Moreover, when reading the information, the transfer transistors T1 and T2 are turned ON by the word line WL, and the voltage equivalent to the voltage by the polarization of the capacitors C1 and C2 is applied to the bit line BL and the complementary bit line /BL, so that the sense amplifier 202 reads out the information held by the capacitors according to a difference between the voltage of the bit line BL and the voltage of the complementary bit line /BL.

It has been reported previously that during the integration of the ferroelectric film into a device, under certain processing conditions degradation of the electrical property of the ferroelectric film which is a dielectric substance of the ferroelectric capacitor in the FeRAM arises over time, and read operation sensing margin of the FeRAM capacitor is reduced.

FIG. 2 shows the electric field versus polarization characteristics of a ferroelectric material.

As shown in FIG. 2, the ferroelectric film has the hysteresis characteristics. For example, when the electric field is applied higher than 2.5 times the negative coercive force –Ec with the ferroelectric film initially in the state of remanent polarization +Pr, will be reversed. The polarization will be saturated when the applied electric field is –Es. which is approximately 2.5 times the Ec or higher. And when the applied electric field is released, it will be in the state of the negative remanent polarization –Pr.

The change of the coercive force Ec and the loss of the remanent polarization Pr are major problems among the degradation of the electrical properties of the ferroelectric film.

It is known that the phenomena originate due to the trapped charge at the interface between the lower electrode layer and the upper electrode layer which sandwiches the ferroelectric film, or the point defect such as oxygen vacancies of the ferroelectric film. Moreover, it is known that degradation of the above-mentioned electrical property will be accelerated by heating or irradiation of UV light.

In addition to the above causes, there is the problem that the hysteresis characteristic of the ferroelectric film will change with the stress applied to the ferroelectric film. For example, the hysteresis characteristic of the ferroelectric film is shifted to positive or negative direction of the applied voltage. In such a case, the coercive voltage Ec changes, and even if a normal writing voltage is applied, the polarization is not reversed by the writing operation.

The stresses applied to the ferroelectric film include the stress applied to the interface of the ferroelectric film by the upper electrode directly formed on the ferroelectric film, the stress by the interlayer dielectric film, the passivation film or the circuit pattern used for multi-layer interconnection structure, and the stress guided to the ferroelectric film with the stress applied to the whole substrate when the ferroelectric film is formed.

Moreover, a silicon substrate having a thickness of about 0.65 mm is usually used for manufacturing FeRAM. Before the semiconductor circuit of FeRAM is formed and packaged, the grinding of the backside of the substrate is carried out, so that the silicon substrate is thinned. When the silicon substrate is thinned, there is an expectation that the influence by the above-mentioned stress by the interlayer dielectric film or the like increases further.

SUMMARY OF THE INVENTION

An object of the present invention is to provide an improved semiconductor device in which the above-mentioned problems are eliminated.

Another object of the present invention is to provide a semiconductor device in which the ferroelectric characteristics of respective ferroelectric capacitors are suitably controlled to enable stable operation of each ferroelectric capacitor.

Another object of the present invention is to provide a semiconductor device in which a ferroelectric capacitor is provided so that the ferroelectric capacitor operates stably over an extended period of time.

Another object of the present invention is to provide a measurement fixture which can easily measure electrical characteristics of a ferroelectric film of a ferroelectric capacitor in a semiconductor device, by applying external electric field while applying stress to the ferroelectric film.

The above-mentioned objects of the present invention are achieved by a semiconductor device comprising: a substrate; a ferroelectric capacitor including a ferroelectric film on the substrate; and a stress application layer which actively applies tensile or compressive stress to the ferroelectric film of the ferroelectric capacitor by deforming the substrate.

The above-mentioned objects of the present invention are achieved by a semiconductor device comprising: a semiconductor substrate; gate electrodes and diffusion regions formed on the substrate; ferroelectric capacitors each including a lower electrode layer, a ferroelectric film and an upper electrode layer, which are stacked over the substrate sequentially and connected to the diffusion regions; and a stress application layer applying tensile or compressive stress to the ferroelectric film of the ferroelectric capacitor, wherein the stress application layer contains a film formed on a back surface of the substrate, the film having a thickness in a range of 1 micrometers to 5 micrometers, and having a coefficient of thermal expansion different from a coefficient of thermal expansion of the substrate.

The above-mentioned objects of the present invention are achieved by a semiconductor device comprising: an IC chip including a semiconductor substrate and a ferroelectric capacitor, the ferroelectric capacitor including a lower electrode layer, a ferroelectric film and an upper electrode layer which are stacked over the substrate sequentially; a die pad supporting the IC chip; and a die attachment layer attaching the IC chip to the die pad, wherein one of the die attachment layer and the die pad is provided to apply tensile or compressive stress to the IC chip.

The above-mentioned objects of the present invention are achieved by a manufacture method of a semiconductor device including a semiconductor substrate and a ferroelectric capacitor, the ferroelectric capacitor including a lower electrode layer, a ferroelectric film and an upper electrode layer which are stacked over the substrate sequentially, the method comprising steps of: forming the ferroelectric film; applying external force to the semiconductor device after the ferroelectric film is formed; and controlling the direction of polarization of the ferroelectric film by the application of the externally applied force.

The above-mentioned objects of the present invention are achieved by a manufacturing method of a semiconductor device, comprising steps of: forming an IC chip so that the IC chip includes a semiconductor substrate and a ferroelectric capacitor, the ferroelectric capacitor including a lower electrode layer, a ferroelectric film and an upper electrode layer which are stacked over the substrate sequentially; attaching the IC chip to a die pad by using a die attachment agent; and applying external force to the IC chip in the attaching step.

The above-mentioned objects of the present invention are achieved by a measurement fixture for a ferroelectric film formed on a substrate of a semiconductor device, the fixture comprising: a mounting port for fixing one end of the substrate such that the substrate is arranged horizontally to place the ferroelectric film on the substrate upside; a moving part movably supporting the other end of the substrate such that the substrate is raised or lowered vertically using a micrometer head on the other end of the substrate where it is supported by the moving part. The micrometer head allows for measurement of substrate vertical position.

According to the present invention, it is possible to provide a semiconductor device which suitably controls the ferroelectric characteristics of respective ferroelectric capacitors to enable stable operation of each ferroelectric capacitor. Moreover, it is possible to provide a semiconductor device in which the ferroelectric capacitor operates stably over an extended period of time. Furthermore, it is possible to provide a measurement fixture for a ferroelectric film of a ferroelectric capacitor in a semiconductor device in which the external electric field can be easily applied to the ferroelectric film while stress is applied thereto in order to measure the electrical characteristics of the ferroelectric capacitor.

BRIEF DESCRIPTION OF THE DRAWINGS

Other objects, features and advantages of the present invention will be apparent from the following detailed description when read in conjunction with the accompanying drawings.

FIG. 19A and FIG. 19B are diagrams for explaining a manufacture method of the semiconductor device of the third preferred embodiment.

DETAILED DESCRIPTION OF PREFERRED EMBODIMENTS

A description will now be given of preferred embodiments of the present invention with reference to the accompanying drawings.

First, a description will be given of a FeRAM of the first preferred embodiment of the invention.

Figure 1:
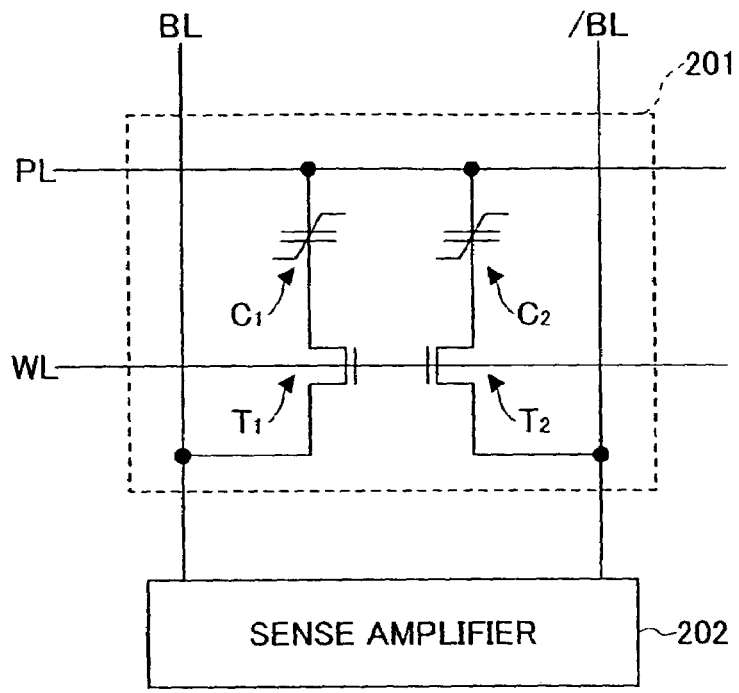
FIG. 1 is a circuit diagram of a memory cell in a conventional FeRAM.
Figure 2:
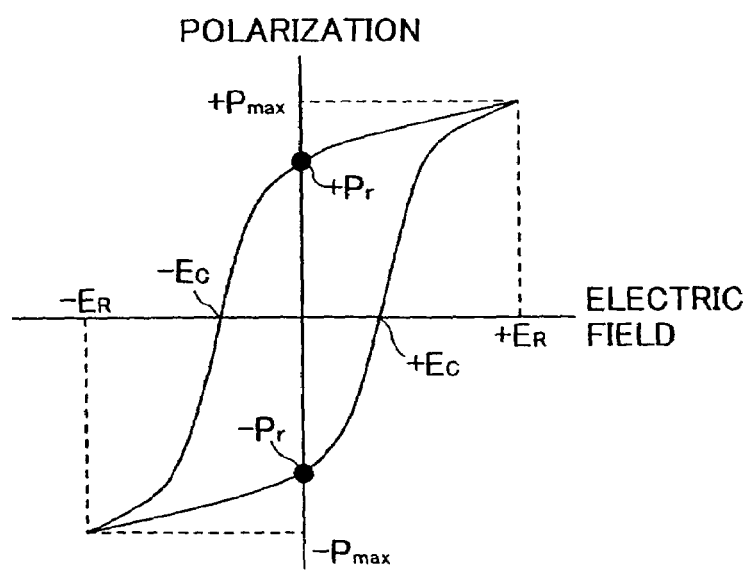
FIG. 2 is a diagram for explaining electric field versus polarization characteristics of a ferroelectric material.
Figure 3:
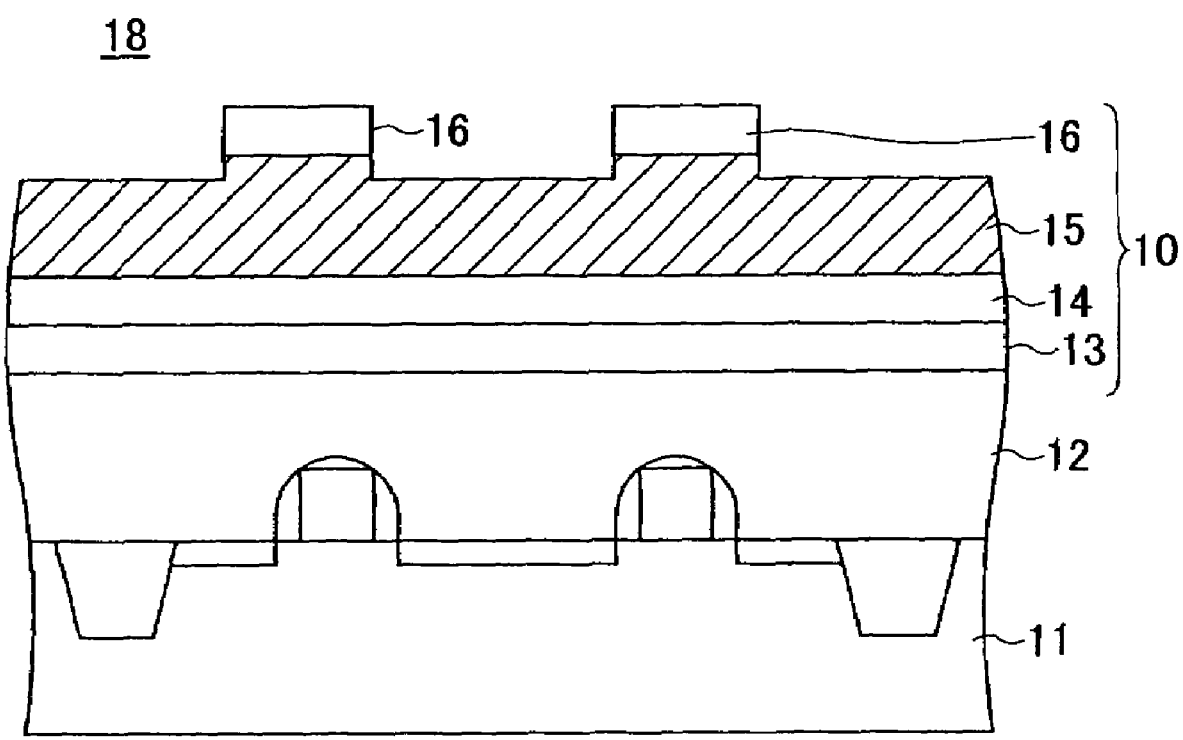
FIG. 3 is a cross-sectional view of the ferroelectric capacitor of a first preferred embodiment of the invention.

FIG. 3 shows the composition of a ferroelectric capacitor 10 of the first preferred embodiment of the invention. In the present embodiment, tensile or compressive stress is applied to the ferroelectric capacitor 10.

As shown in FIG. 3, the interlayer dielectric film 12 covering the CMOS structure is deposited on the Si substrate 11. The Ti adherence layer 13 having a thickness of 20 nm is deposited on the interlayer dielectric film 12 by sputtering. In addition to Ti, $TiO_2$, $IrO_2$, or AlOx may also be used for the adhesion layer. Moreover, the lower electrode layer 14 composed of Pt having a thickness of about 175 nm is further deposited on the above-mentioned Ti adherence layer 13 by sputtering.

However, the material of the lower electrode layer 14 is not limited to Pt, and it may be any of platinum group metals or those alloys, or a conductive oxide such as $IrO_2$, $RuO_2$, or $SrRuO_3$.

In the ferroelectric capacitor 10 of FIG. 3, the ferroelectric film 15 which contains the PZT or PLZT film is deposited on the lower electrode layer 14 by RF sputtering so as to have a thickness of 200 nm, and thinner films of 120 or 150 nm may also be used.

In addition, the ferroelectric film 15 is crystallized by carrying out rapid heat treatment in Ar atmosphere which contains $O_2$ by 5% or less in concentration.

Furthermore, on the ferroelectric film 15, the upper electrode layer 16 which is composed of $IrO_2$ and has a thickness of about 200 nm is deposited. For the piezoresponse measurements an electrode with a thickness of 50 nm was used to more clearly view the ferroelectric domains.

For the purpose of measurement of the hysteresis characteristic of the ferroelectric film, which will be described below, anisotropic etching is carried out for a part of the upper electrode layer 16, so that the ferroelectric capacitor 10 shown FIG. 3 is formed.

Next, a description will be given of the measurement of the hysteresis characteristic of the ferroelectric film 15 of the first preferred embodiment.

Figure 4:
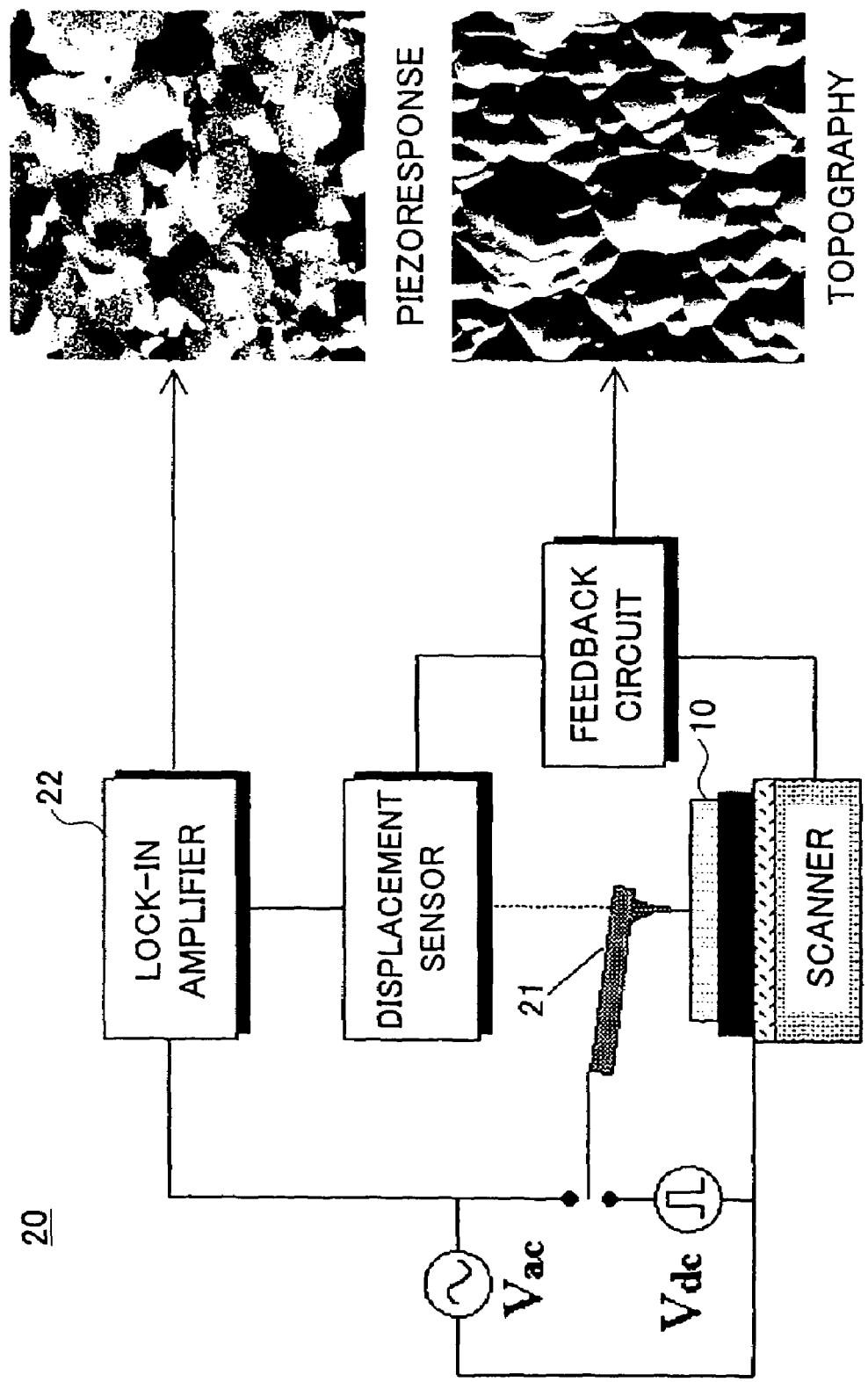
FIG. 4 is a diagram for explaining the composition of a piezoresponse force microscope.

FIG. 4 shows the composition of a piezoresponse force microscope 20 which is one of scanning probe microscopes (which is called SPM 20).

With reference to FIG. 4, the probe of the cantilever 21 which is formed from the material of Pt/Ir coated Si is used in the SPM 20 ("AutoProbe M5" was manufactured by the U.S. company Thermoscopes but currently owned by. Veeco), and the Stanford Research Inc. DSP 830 is used as the lock-in amplifier 22.

The d.c. voltage Vdc and the a.c. voltage Vac are applied to the cantilever 21 while connecting to the ground potential the lower electrode layer 14 of the ferroelectric capacitor 10 which is a measurement sample, so that the direct-current electric field and the alternating current electric field are applied to the ferroelectric film 15. The hysteresis characteristic of the ferroelectric film 15 and the distribution of the polarization state are measured. Moreover, the topography is measured by the SPM 20.

Figure 5:
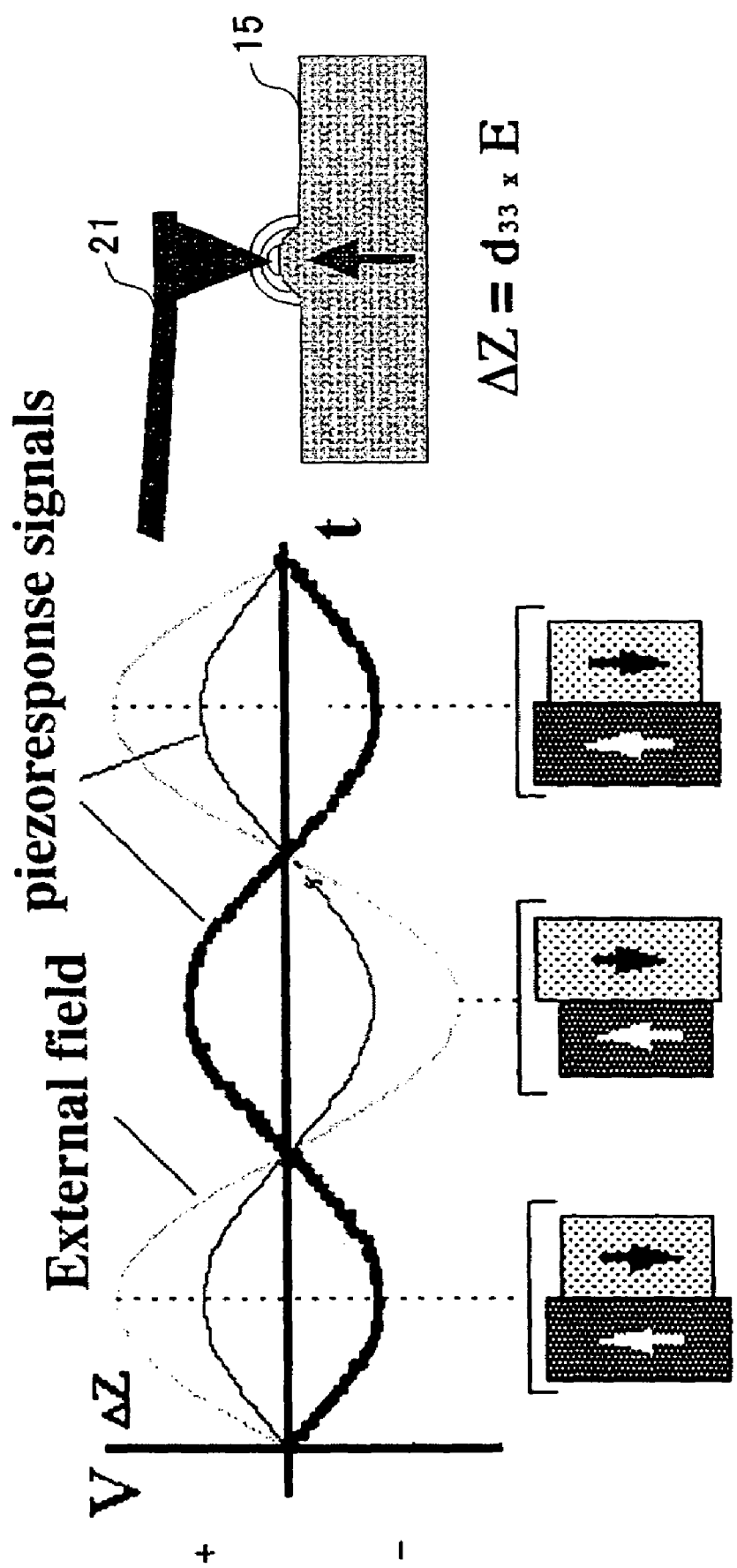
FIG. 5 is a diagram for explaining the procedure of measurement of strain hysteresis loop and polarization state of a ferroelectric film.

FIG. 5 is a diagram for explaining the principle which measures the strain hysteresis characteristic, ferroelectric domain orientation and displacement of the ferroelectric capacitor.

With reference to FIG. 5, the lower electrode of the ferroelectric capacitor 10 is grounded electrically, and the a.c. voltage Vac of 0.8 V(rms) is applied to the ferroelectric film between the cantilever 21 and the lower electrode layer 14.

According to the electric field E by the applied voltage Vac, the amounts of upward displacement and downward displacement change, and the ferroelectric film 15 expands and contracts by delta Z ($=d_{33} \times E$).

The cantilever 21 is set in the contact mode and the scanning of the electrode is carried out while applying a sinusoidal AC voltage to the capacitor so that the vertical displacement of the surface of the film 15 is expressed as the amplitude.

Moreover, the change of the direction of the domain orientation corresponds to the polarity of the a.c. voltage is expressed as the phase. By detecting these changes with the lock-in amplifier 22 (shown in FIG. 4), the direction of the ferroelectric domain orientation and vertical displacement or amplitude of the above-mentioned ferroelectric film 15 can be measured simultaneously and represented as an image map.

In the present embodiment, the hysteresis characteristic of the ferroelectric capacitor is measured with a piece of the sample with a size of 2 cm×3 cm, cut from the wafer of the ferroelectric capacitor, and by applying tensile or compressive stress to the piece of sample by hand or by using the stress measurement fixture which will be described below. Measurements are also possible on whole wafers as well.

Since the Si substrate occupies most of the thickness of the ferroelectric capacitor, when both ends of the piece of the sample are fixed and stress is applied near the center of the substrate in the direction from the substrate back side to the substrate front side, tensile stress is applied to the ferroelectric film. On the other hand, when stress is applied in the direction from the substrate front side to the substrate backside, compressive stress is applied to the ferroelectric film.

Figure 6A:
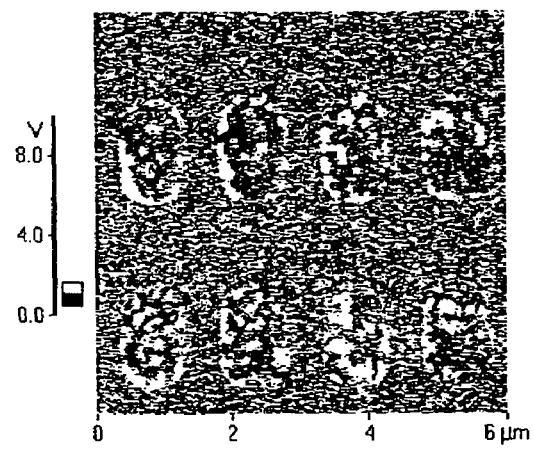
FIG. 6A, FIG. 6B, FIG. 6C and FIG. 6D are diagrams showing the topography and polarization state of a ferroelectric capacitor (the piezoresponse force microscope measurements) before and after application of tensile stress.
Figure 6C:
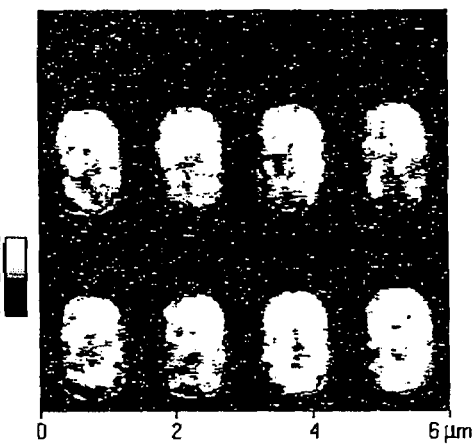
Figure 6B:
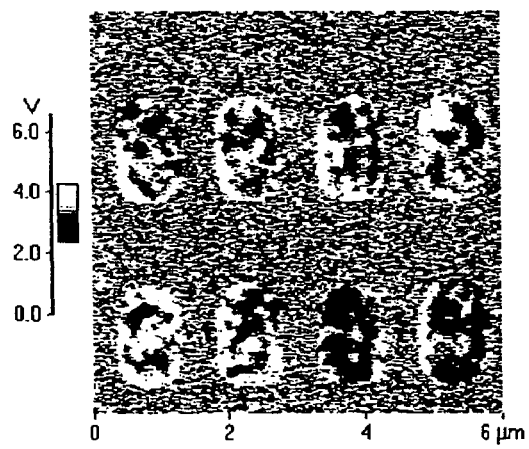
Figure 6D:
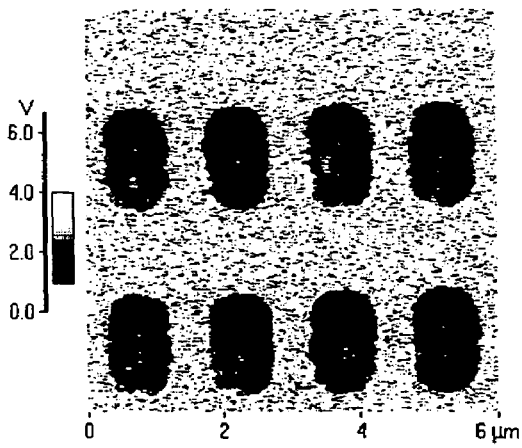

FIG. 6A and FIG. 6B show the topography and polarization state of the ferroelectric capacitor of the present embodiment, before the application of tensile stress, and FIG. 6C and FIG. 6D show the topography and polarization state of the ferroelectric capacitor after the application of tensile stress.

As shown in FIG. 6A and FIG. 6C, the upper electrodes are arranged in two rows and four columns on the ferroelectric film. The capacitors measured were within an array of capacitors. As shown in FIG. 6B, before the application of tensile stress, it is divided into the ferroelectric domains and the domain spontaneous polarization is in various directions (indicated by the gray contrast level between white and black).

As shown in FIG. 6D, after the application of tensile stress, the ferroelectric domains are mostly set in the single domain state (indicated in black), and it is turned out that the direction of polarization is the direction from the upper electrode layer to the lower electrode layer.

Figure 7A:
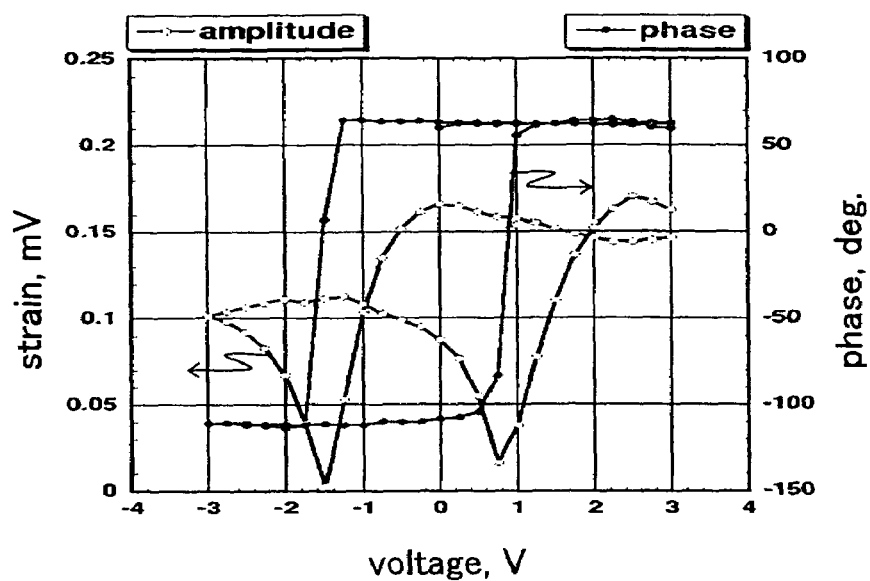
FIG. 7A and FIG. 7B are diagrams showing the strain hysteresis loop and polarization state of the ferroelectric capacitor before and after application of tensile stress.
Figure 7B:
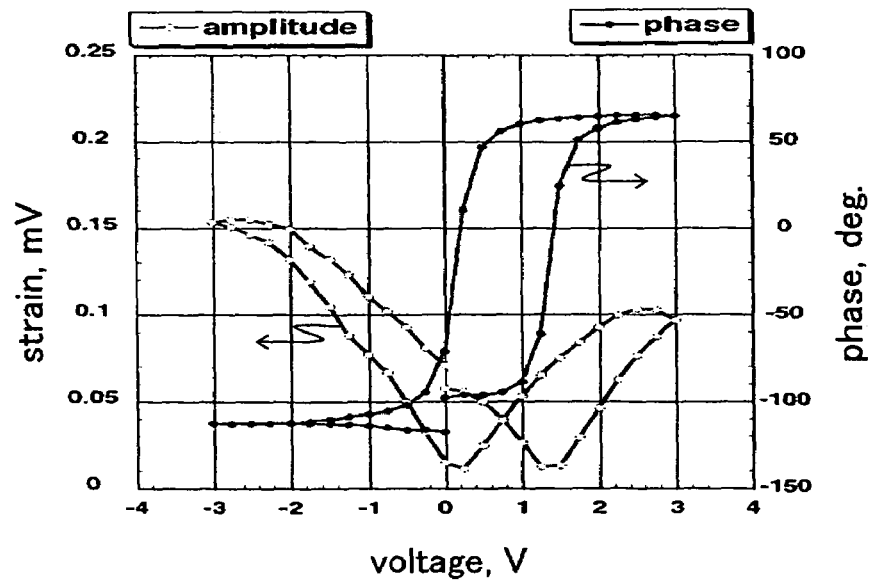

FIG. 7A and FIG. 7B show the strain hysteresis curve and strain magnitude of the ferroelectric capacitor of the present embodiment before and after the application of tensile stress.

FIG. 7A shows the strain hysteresis curve and strain magnitude state of the ferroelectric capacitor before the application of tensile stress, and FIG. 7B shows the strain hysteresis curve and polarization state of the ferroelectric capacitor after the application of tensile stress.

As shown in FIG. 7A and FIG. 7B, when the states before and after the application of tensile stress are compared, it is turned out that the strain hysteresis curve (the vertical axis is indicated by "strain") in the butterfly form is shifted towards the right direction (the positive potential) of the voltage. Moreover, it is turned out that the phase hysteresis curve (the vertical axis is indicated by "phase") which shows the polarization state is also shifted towards the right direction (the positive potential) of the voltage. In addition, the measurement is performed for each of the upper electrodes arranged in two rows and four columns, and the same results are obtained about the strain hysteresis curve and the butterfly loop.

Furthermore, after the above-described measurement is performed, the ferroelectric capacitor is left over ten days and the same measurement is performed again. It is turned out that the characteristics of the ferroelectric capacitor shown in FIG. 6D and FIG. 7B remain unchanged.

Therefore, when tensile stress is applied to the ferroelectric film, the polarization state can be switched in one direction in which the direction of polarization is set in the direction from the upper electrode to the lower electrode, and the characteristics, such as the strain loop and the polarization loop, can be suitably switched. Furthermore, it is demonstrated that these characteristics of the ferroelectric capacitor are nonvolatile for several days.

Figure 8A:
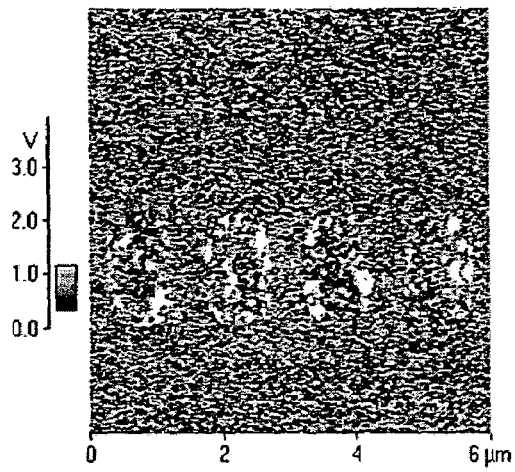
FIG. 8A, FIG. 8B, FIG. 8C and FIG. 8D are diagrams showing the topography and polarization state of the ferroelectric capacitor (the piezoresponse force microscope measurements) before and after application of compressive stress.
Figure 8B:
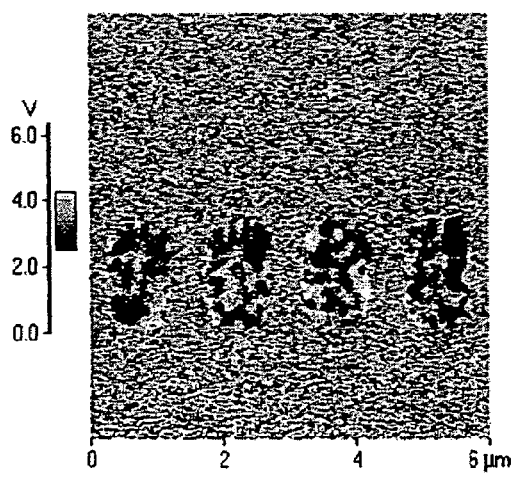
Figure 8C:
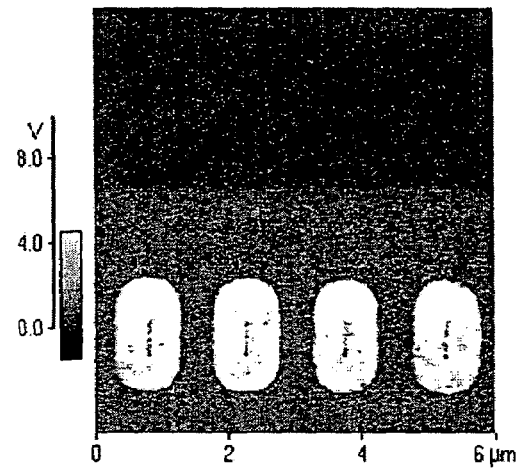
Figure 8D:
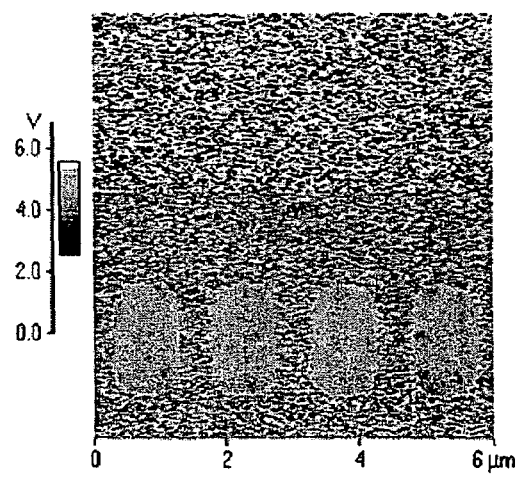

FIG. 8A and FIG. 8B show the topography and polarization state of the ferroelectric capacitor of the present embodiment before the application of compressive stress, and FIG. 8C and FIG. 8D show the topography and polarization state after the application of compressive stress.

As shown in FIG. 8A and FIG. 8C, the upper electrodes are arranged in one row and four columns. With reference to FIG. 8B, before applying compressive stress, it is divided into the ferroelectric domains and the spontaneous polarization is in various directions.

On the other hand, as shown in FIG. 8D, after the application of compressive stress, the ferroelectric domains are mostly set in the single domain (indicated in white), and it is turned out that the direction of polarization is the direction from the lower electrode to the upper electrode.

Figure 9A:
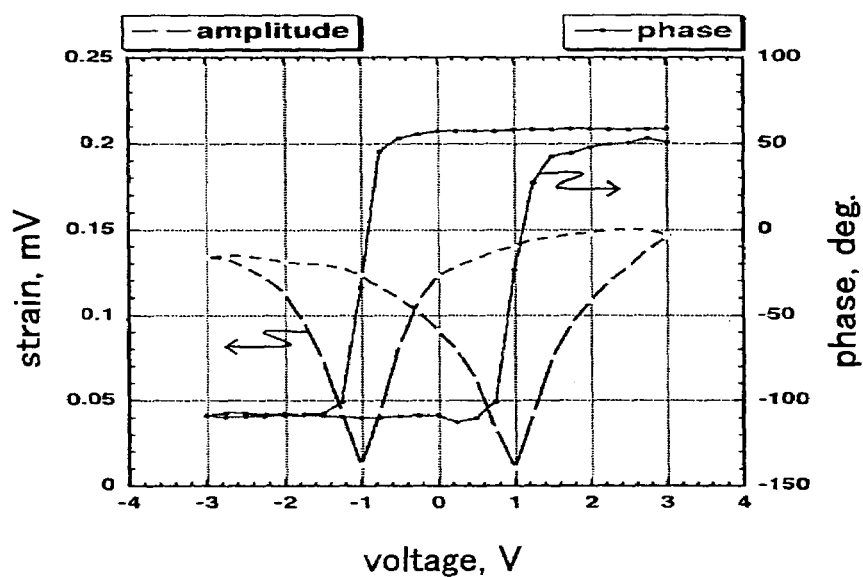
FIG. 9A and FIG. 9B are diagrams showing the strain hysteresis loop and polarization state of the ferroelectric film before and after application of compressive stress.
Figure 9B:
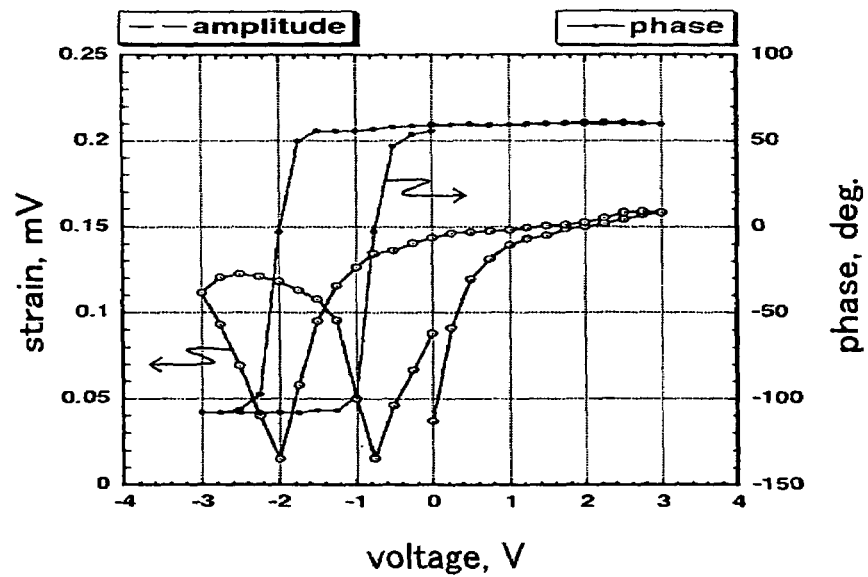

FIG. 9A and FIG. 9B show the strain hysteresis curve and polarization state of the ferroelectric capacitor of the present embodiment before and after the application of compressive stress. FIG. 9A shows the strain hysteresis curve and polarization state of the ferroelectric capacitor before the application of compressive stress, and FIG. 9B shows the strain hysteresis curve and polarization state of the ferroelectric capacitor after the application of compressive stress.

As shown in FIG. 9A and FIG. 9B, when the states before and after the application of compressive stress are compared, it turned out that the strain hysteresis curve (the vertical axis is indicated by "strain.") in the butterfly form is shifted towards the left direction (the negative potential) of the voltage. Moreover, it is turned out that the phase hysteresis curve (the vertical axis is indicated by "phase") which shows the polarization state is also shifted towards the left direction (the negative potential) of the voltage. In addition, the measurement is performed for each of the upper electrodes arranged in one row and four columns, and the same results are obtained about the strain hysteresis curve and the hysteresis loop.

Furthermore, after the above-described measurement is performed, the ferroelectric capacitor is left over ten days and the same measurement is performed again. It is turned out that the characteristics of the ferroelectric capacitor shown in FIG. 8D and FIG. 9B remain unchanged.

Therefore, when compressive stress is applied to the ferroelectric film, the polarization state can be switched in one direction in which the direction of polarization is set in the direction from the lower electrode to the upper electrode, and the characteristics, such as the strain loop and the polarization loop, can be suitably switched. Furthermore, it is demonstrated that these characteristics of the ferroelectric capacitor are nonvolatile.

According to the present embodiment, by the application of stress to and its release from the ferroelectric capacitor film, the characteristics of the ferroelectric capacitor, such as the direction of polarization, the strain loop, and the polarization loop, can be suitably controlled.

In the semiconductor device equipped with the ferroelectric capacitor (for example, the FeRAM), the characteristics of the ferroelectric capacitor used for the memory cell can be suitably controlled with a sufficiently high level of accuracy, and reading/writing operation of the FeRAM can be stabilized with high accuracy.

Next, a description will be given of the fixture for measurement of the semiconductor device according to the present invention.

In the above-described embodiment, the substrate on which the ferroelectric capacitor is formed is pressed by hand to apply stress to the ferroelectric film therein. In order to measure the polarization state at the time of application of stress in detail, the measurement fixture of the present invention is provided which enables the application of stress and heat to the measurement sample in a controlled quantity. In addition, the measurement fixture of the present invention enables the measurement to be performed using the SPM (the scanning probe microscope) in a state in which the stress and heat are applied to the sample.

Figure 10:
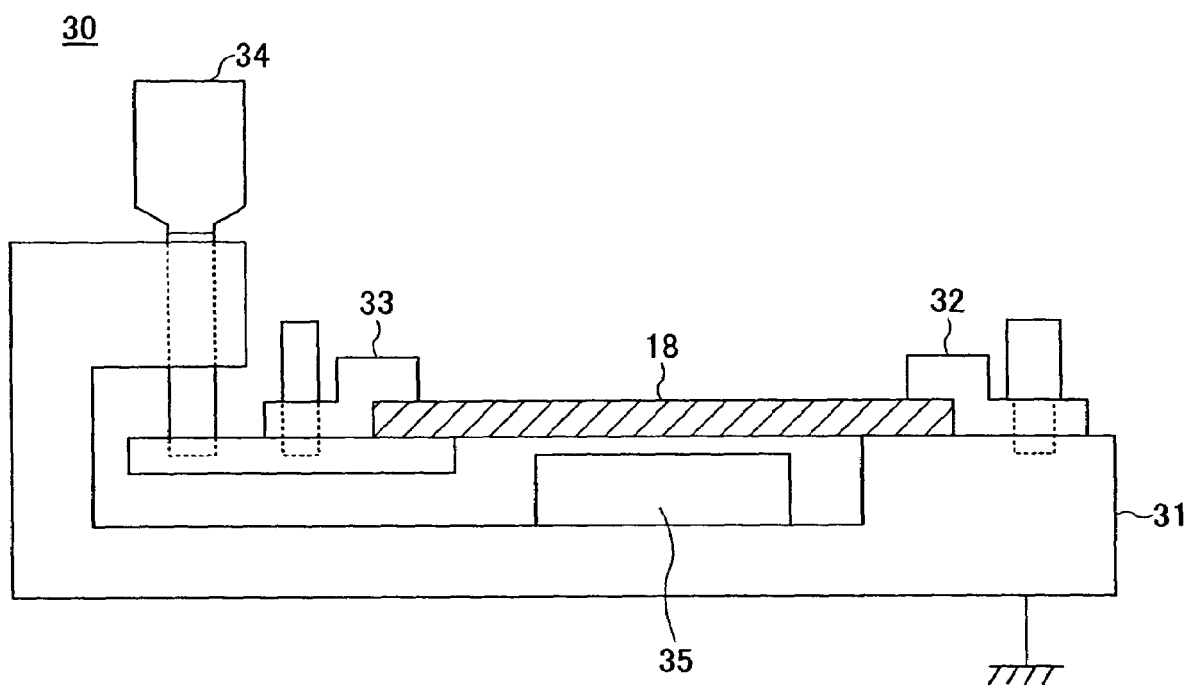
FIG. 10 is a cross-sectional view of a measurement fixture according to the invention.

FIG. 10 shows the composition of a measurement fixture according to the present invention.

As shown in FIG. 10, the fixture 30 includes a base object 31, a substrate fixing part 32, a movable part 33, a micrometer head 34, and a heater 35. The base object 31 is a stand on which the ferroelectric capacitor 10 of the present embodiment is mounted. The substrate fixing part 32 fixes one end of the substrate 18 in the longitudinal direction to the base object 31, and in the substrate 18 the ferroelectric capacitor 10 of the present embodiment is formed. The substrate 18 is cut out in the size of 5 mm×65 mm, for example. The moving part 33 movably supports the other end of the substrate 18 to the base object 31 such that the substrate 18 is movable slightly in the vertical direction. The micrometer head 34 moves vertically the other end of the substrate 18 where it is supported by the moving part 33, in a controlled manner. The heater 35, which is provided beneath the substrate 18, applies heat to the substrate 18.

Furthermore, the lower electrode of the ferroelectric capacitor 10 and the fixture 30 are electrically connected together (not shown in FIG. 10), and the fixture 30 is grounded.

The substrate 18 in which the ferroelectric film 15 of the present embodiment is formed is arranged and fixed to the fixture 30 so that the ferroelectric film 15 (the measurement side) is placed upside. By using the micrometer head 34 of the fixture 30, the end of the substrate 18 is raised or lowered to the maximum of ±2 mm, so that the substrate 18 is curved downward or upward. Although the current jig shows one end of the substrate is fixed, it is possible to have to micrometer heads or similar devices for vertical displacement on both ends. In addition, it is possible to use a biaxial stress jig where the edges of the wafer are clamped and the center portion is raised or lowered to create stress in the film.

For example, when the end of the substrate 18 is raised from the base object 31, the substrate 18 is curved downward so that compressive stress is applied to the ferroelectric film 15 formed on the substrate 18. On the other hand, when the end of the substrate 18 is lowered from the base object 31, the substrate 18 is curved upward so that tensile stress is applied to the ferroelectric film 15 of the substrate 18.

Moreover, the fixture 30 is configured so that the substrate 18 is supported almost horizontally and the measurement side is level. Hence, the fixture 30 is suitable for measurement of the SPM. The lower electrode of the substrate 18 is grounded through the fixture 30, and the voltage is easily applied between the cantilever 21 and the lower electrode 14 of the ferroelectric capacitor 10, so that the measurement of the hysteresis characteristic of the ferroelectric capacitor 10 can be easily performed. In addition, the substrate 18 can be heated by the heater 35, the measurement of the temperature characteristics of the ferroelectric capacitor 10, including the temperatures beyond the Curie point of the ferroelectric film 15, can be easily measured.

Next, a description will be given of the second preferred embodiment of the invention.

Figure 11:
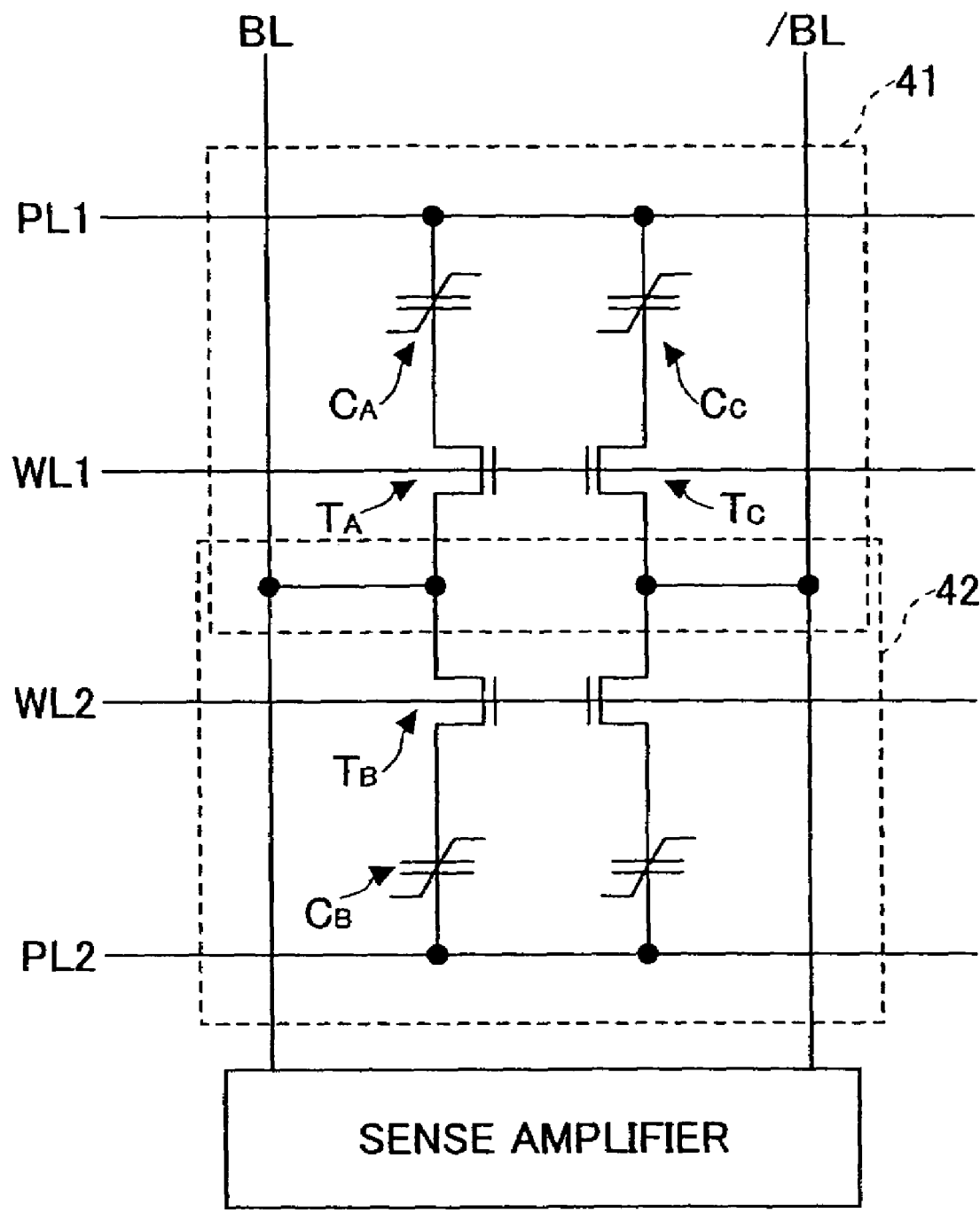
FIG. 11 is a circuit diagram of memory cells in a FeRAM of a second preferred embodiment of the invention.
Figure 12:
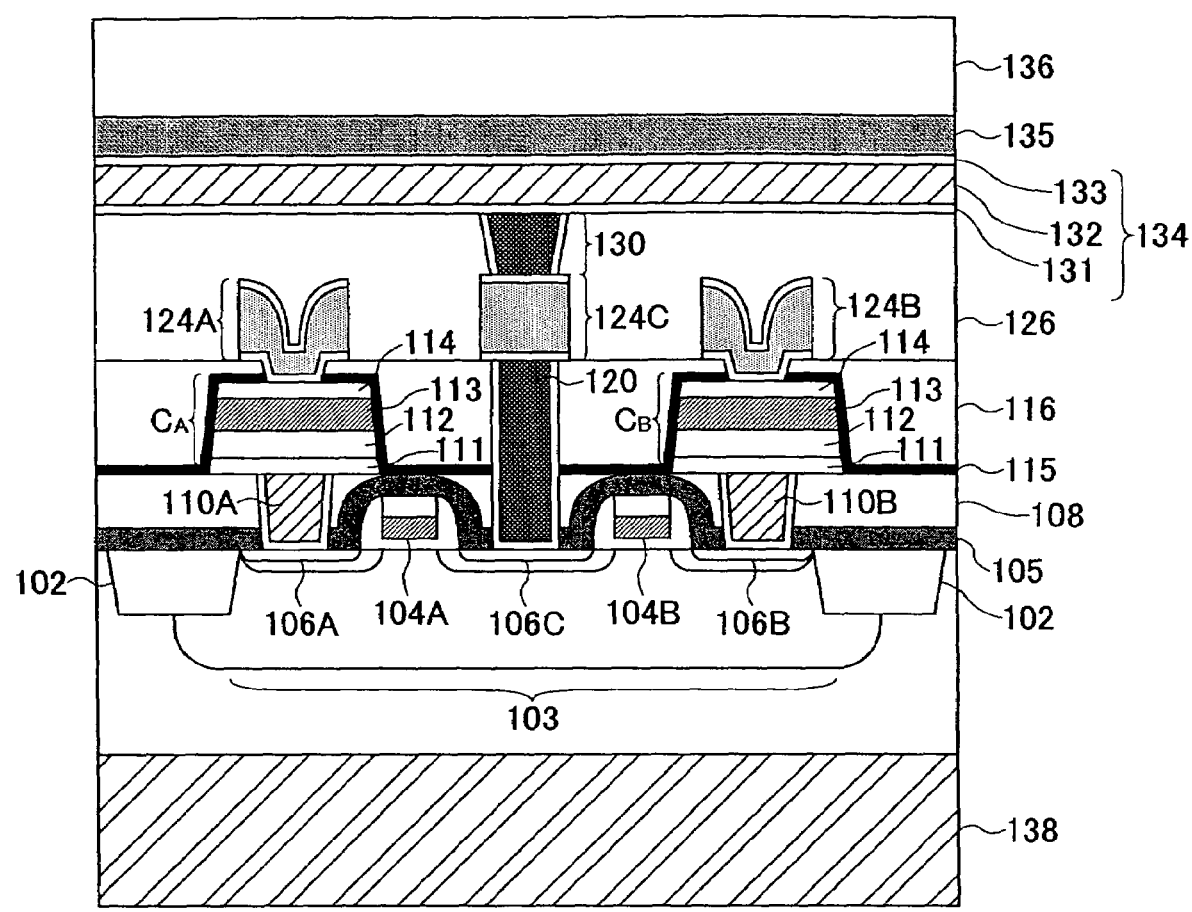
FIG. 12 is a cross-sectional view of a stacked capacitor type FeRAM of the second preferred embodiment.

FIG. 11 is a circuit diagram of memory cells in a FeRAM of the second preferred embodiment of the invention. FIG. 12 is a sectional view of a stacked capacitor type FeRAM of the second preferred embodiment.

As shown in FIG. 11, each of the memory cells of this FeRAM is arranged in the 2T2C composition, and two selector transistors TA and TC and two ferroelectric capacitors CA and CC are used in order to store the 1-bit information.

The two adjoining memory cells 41 and 42 which are connected to the bit line BL shown in FIG. 11 are arranged as shown in FIG. 12. In the two adjoining memory cells 41 and 42, the selector transistor TA and the ferroelectric capacitor CA of the memory cell 41 and the selector transistor TB and the ferroelectric capacitor CB of the memory cell 42 are arranged as shown in FIG. 12.

The stacked capacitor type FeRAM of this embodiment of FIG. 12, the gate electrodes 104A and 104B of the selector transistors TA and TB which are formed by the CMOS process are connected to the word lines WL1 and WL2 shown in FIG. 11, respectively. The ferroelectric capacitors CA and CB which contain the ferroelectric film 113 are formed over the contact plugs 110A and 110B which are connected to the diffusion regions 106A and 106B respectively. The ferroelectric capacitors CA and CB are formed simultaneously by etching. That is, the ferroelectric capacitors CA and CB are of the stacked capacitor type structures.

In the ferroelectric capacitors CA and CB, the upper electrode layer 114 is covered by the silicon oxide 115, and the upper electrode layer 114 and the plate lines 124A and 124B (indicated by "PL1" and "PL2" in FIG. 11) are connected together through the contact holes 116A and 116B which are formed in the silicon oxide 115. Furthermore, the contact plug 120 is formed in the diffusion region 106C, and the bit line 134, which is formed above the ferroelectric capacitors CA and CB, and the diffusion region 106C are connected together through the contact plugs 120, 124C and 130.

In the FeRAM of the present embodiment, a stress-application film 138 having a thickness of 1 micrometers is formed on the backside of the Si substrate 101 which is thinned. The stress-application film 138 is provided to apply tensile or compressive stress to the ferroelectric film 113 of the ferroelectric capacitors CA and CB through the Si substrate 101.

Next, a description will be given of the manufacture method of the stacked capacitor type FeRAM of the present embodiment.

FIG. 13A through FIG. 16B are diagrams for explaining the manufacture method of the FeRAM of the present embodiment.

Figure 13A:
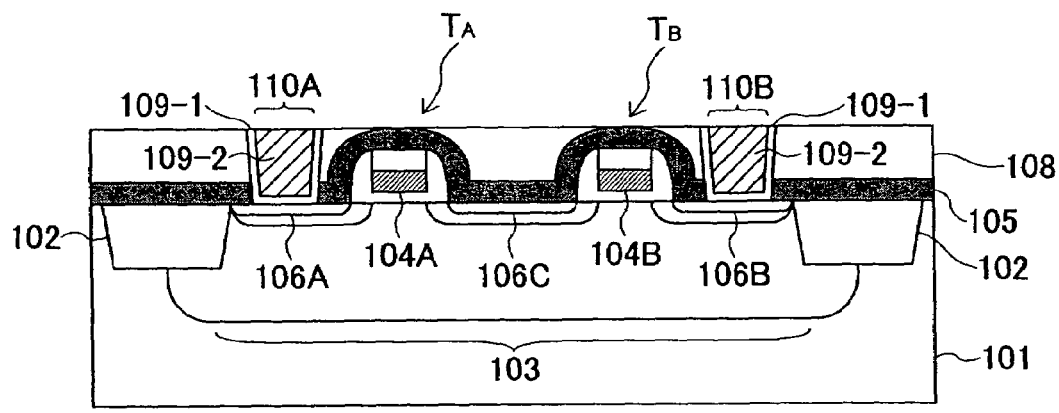
FIG. 13A, FIG. 13B and FIG. 13C are diagrams for explaining a manufacture method of the FeRAM of the second preferred embodiment.

At the step of FIG. 13A, the element isolation region 102 and the element region 103 are deposited on the substrate 101 by the STI according to the CMOS process, and the gate insulator layer is deposited on the upper part of the element region 103 so that the gate electrodes 104A and 104B are formed to constitute the selector transistors TA and TB respectively. In addition, the gate electrodes 104A and 104B are provided to extend in the direction at right angles to the paper of the figure.

Moreover, at the step of FIG. 13A, the SiN insulator layer 105 is deposited on the upper surfaces of the selector transistors TA and TB and the substrate 101, and the interlayer dielectric film 108 of the silicon oxide is deposited further on the insulator layer 105.

The contact holes in the upper surface of the diffusion regions 106A and 106B in the element region 103 are formed by using the patterned resist and the RIE method. By being filled with the TiN adherence film 109-1 and the tungsten 109-2, the contact plugs 110A and 110B for connecting the diffusion regions 106A and 106B and the ferroelectric capacitors CA and CB are formed.

Furthermore, the upper surfaces of the interlayer dielectric film 105 and the contact plugs 110A and 110B are ground by the CMP (chemical and mechanical polishing) method.

Figure 13B:
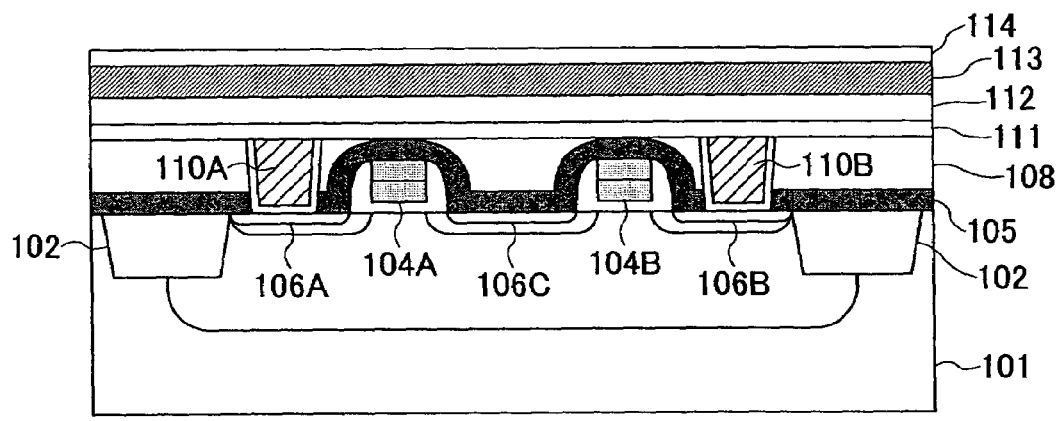

Next, at the step of FIG. 13B, the Ti adherence film 111 and the lower electrode layer 112 are deposited on the upper surfaces of the ground interlayer dielectric film 108 and the contact plugs 110A and 110B in this order one by one.

In the present embodiment, the Ti adherence film 111 has a thickness of 100 nm, and the lower electrode layer 112 has a thickness of 50 nm. The lower electrode layer 112 is composed of any of the platinum group metals or their alloys or conductive oxides, such as $IrO_2$, $RuO_2$, $SrRuO_2$, etc.

Moreover, at the step of FIG. 13B, the ferroelectric film 113 which contains the PZT or PLZT film is further deposited on the lower electrode layer 112. The ferroelectric film 113 may be deposited by using the RF (radio-frequency) sputtering, the CSD (chemical solution deposition) process, or the CVD (chemical vapor deposition) process. In the present embodiment, the RF sputtering is used by setting the Ar gas pressure to 1.1 Pa and setting the RF power to 1.0 kW, and the ferroelectric film 113 is deposited to a thickness of 200 nm.

The ferroelectric film 113 is crystallized by carrying out rapid thermal annealing (RTA) for 90 seconds at 600 deg. C. in the Ar atmosphere containing $O_2$ by 5% or less of concentration. Further, the crystallization of the ferroelectric film 113 is carryied out by RTA (rapid heat treatment) again for 60 seconds at 750 deg. C. in an oxidizing atmosphere.

In addition, the oxide which has the perovskite crystal structure is appropriate for the ferroelectric film 113 of the present embodiment. The perovskite crystal structure of the oxide contains one of $Pb(Zr_{1-x}Ti_x)O_3$ ($0 \leq x \leq 1$), $(Pb_{1-y}La_y)(Zr_{1-x}Ti_x)O_3$ ($0 \leq x, y \leq 0.1$), $Ba(Sr_{1-x}Ti_x)O_3$ ($0 \leq x \leq 1$), or $BiLaTiO_z$.

Moreover, also appropriate for the ferroelectric film 113 are the oxide which has the tungsten-bronze crystal structure, and the oxide which has the layered perovskite crystal structure, such as $Bi_{3.25}La_{0.75}Ti_3O_{12}$, SBT ($SrBi_2Ta_2O_9$), etc.

The above-mentioned oxides exhibit excellent ferroelectric characteristics, the square shape nature of the hysteresis curve is good, and they have.little dispersion of the coercive field of each ferroelectric film, and can stabilize the writing operation of FeRAM further.

Moreover, at the step of FIG. 13B, the upper electrode layer 114 is deposited on the ferroelectric film 113. The upper electrode layer 114 has a thickness of 200 nm, and is composed of any of the platinum group metals or their alloys or conductive oxides, such as $IrO_2$, $RuO_2$, $SrRuO_3$, etc. Alternatively, the upper electrode layer 114 may have a laminated structure having the conductive oxide, such as $Ir/IrO_2$, or $IrOx/IrO_2$ where the x is less than 2 on the ferroelectric film 113 side. When forming the upper electrode layer 114 with Ir, the RF sputtering is performed in the Ar atmosphere containing $O_2$ by 5% or less of concentration to deposit IrOx film.

Figure 13C:
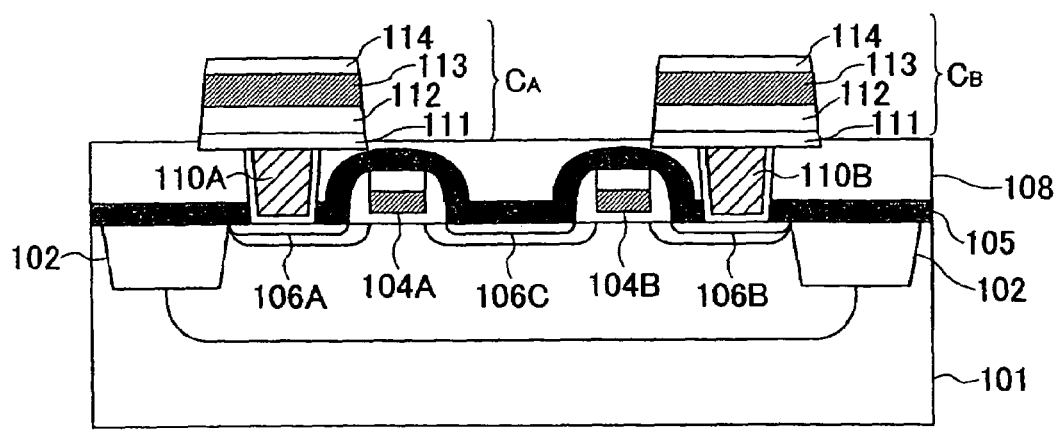

Next, at the step of FIG. 13C, the Ti adherence layer 111, the lower electrode layer 112, the ferroelectric film 113, and the upper electrode layer 114, which are located over the contact plugs 110A and 110B, are left through the photolithography method and the RIE method. Thereby, the ferroelectric capacitors CA and CB are formed.

Figure 14A:
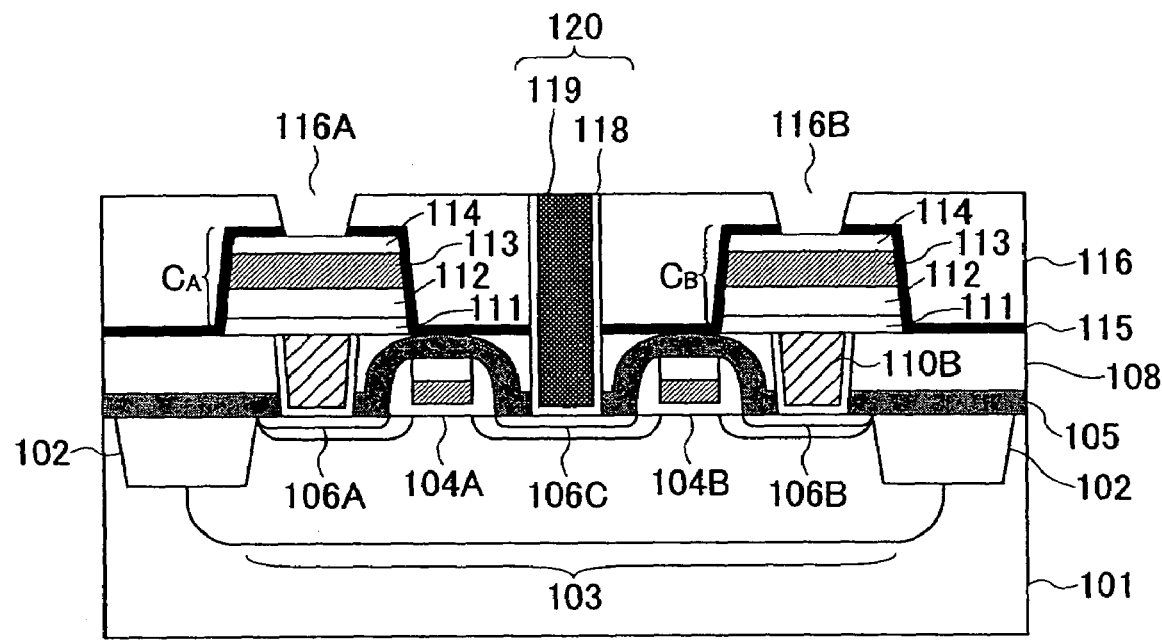
FIG. 14A and FIG. 14B are diagrams for explaining the manufacture method of the FeRAM of the second preferred embodiment.

Next, at the step of FIG. 14A, the silicon oxide 115 is deposited on the structure of FIG. 13C by the CVD process, and the interlayer dielectric film 116 is further deposited by the CVD process. Moreover, the upper surface of the deposited interlayer dielectric film 116 is ground by the CMP process.

Moreover, at the step of FIG. 14A, the contact hole at which the diffusion region 106C is exposed in the SiN insulator layer 105, the interlayer dielectric film 108, the silicon oxide 115, and the interlayer dielectric film 116, is formed. By being filled with the TiN adherence film 118 and the tungsten 119, the contact plug 120 is formed.

Moreover, at the step of FIG. 14A, the contact holes 116A and 116B are formed through the photolithography method and the RIE method where the upper electrode layer 114 is exposed to the silicon oxide 115 and the interlayer dielectric film 116, which are deposited on the upper part of the upper electrode layer 114 of the ferroelectric capacitors CA and CB.

Figure 14B:
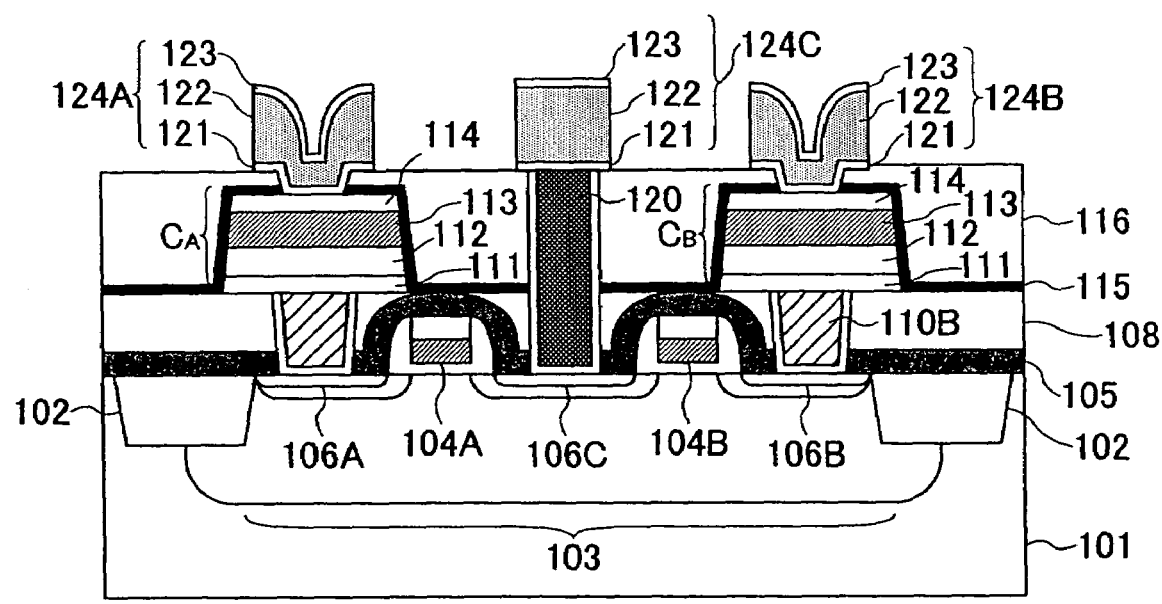

Next, at the step of FIG. 14B, the TiN adherence film, the first aluminum metal layer, and the TiN adherence film, each of which has a thickness of 20 nm typically, are deposited on the structure of FIG. 14A, in this order one by one.

Moreover, at the step of FIG. 14B, the circuit pattern which is provided to extend in the direction at right angles to the paper of the figure is deposited through the photolithography method and the RIE method, and the electrode pattern 124C which is connected to the contact plug 120 and the circuit patterns 124A and 124B as the plate lines linked to the upper electrode layer 114 of the ferroelectric capacitors CA and CB is formed.

Figure 15A:
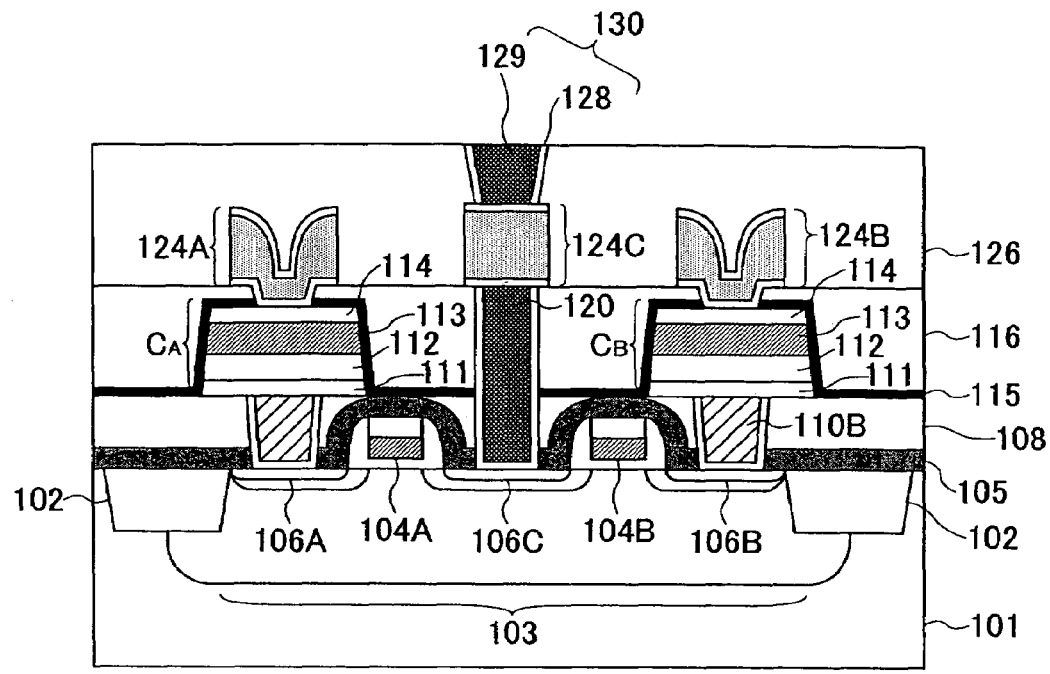
FIG. 15A and FIG. 15B are diagrams for explaining the manufacture method of the FeRAM of the second preferred embodiment.

Next, at the step of FIG. 15A, the interlayer dielectric film 126 is deposited on the structure of FIG. 14B by the CVD process, and the upper surface of the interlayer dielectric film 126 is ground by the CMP process.

Moreover, at the step of FIG. 15A, the contact hole at which the electrode pattern 124C is exposed is formed in the interlayer dielectric film 126, and the contact plug 130 is formed by filling the contact hole with the TiN adherence film 128 and the tungsten plug 129.

Figure 15B:
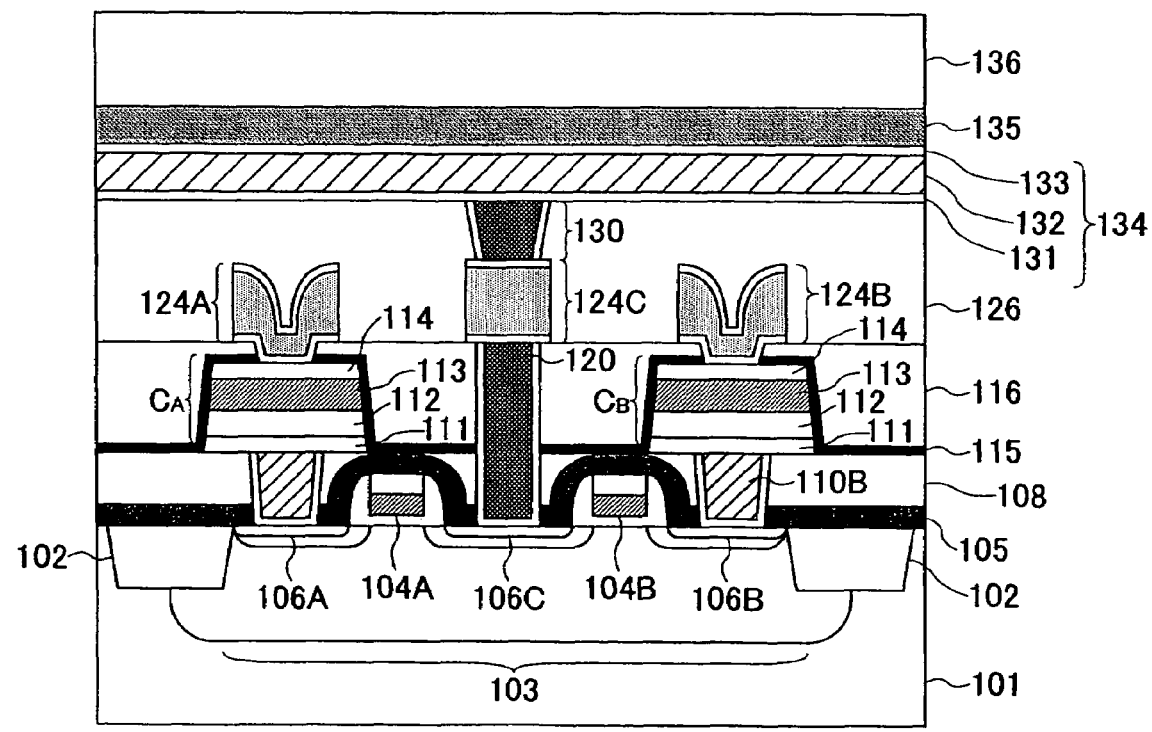

Next, at the step of FIG. 15B, the TiN adherence film 131, the second aluminum metal layer 132, and the TiN adherence film 133 are deposited on the structure of FIG. 15A in this order one by one. The laminated structure of these layers is formed into the bit line pattern 134 as a bit line which extends in the longitudinal direction, through the photolithography method and the RIE method. Thereby, the bit line pattern 134 and the diffusion region 106C are electrically connected together.

Moreover, at the step of FIG. 15B, the silicon oxide layer 135 which covers the bit line pattern 134 and the interlayer dielectric film 126 is deposited by the CVD process.

Furthermore, at the step of FIG. 15B, the passivation film 136 is deposited on the upper surface of the silicon oxide 135 by the CVD process. And above this film is deposited a polyimide film with a thickness of 3 micrometers. The polyimide is cured at temperature of 300 C. The polyimide has a thermal expansion coefficient of $6 \times 10^{-6}$.

Figure 16:
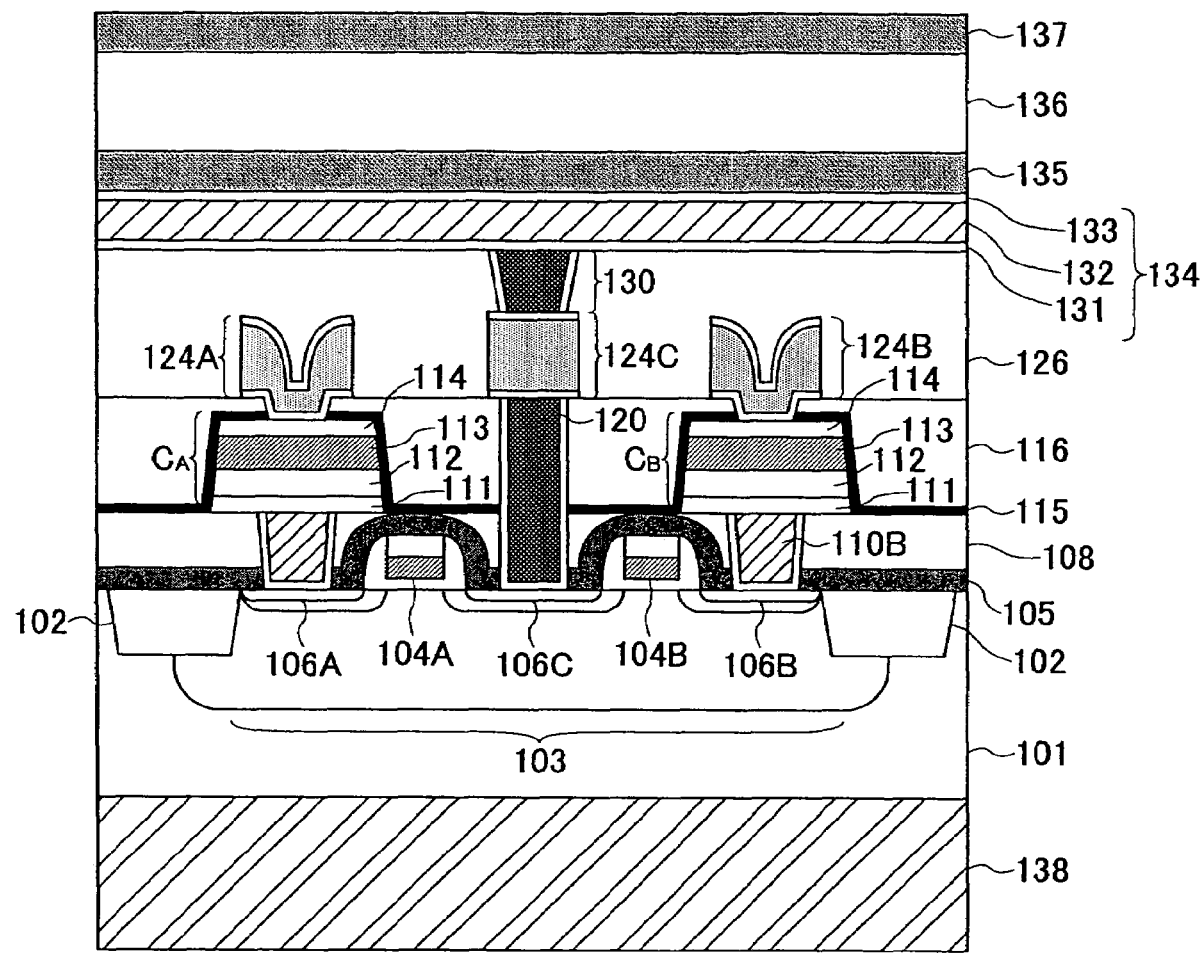
FIG. 16 is a diagram for explaining the manufacture method of the FeRAM of the second preferred embodiment.

Next, at the step of FIG. 16, the grinding of the back surface of the substrate 101 is performed. Specifically, the masking tape 137 which prevents the cracking of the substrate surface is attached to the passivation film 136, and the back surface of the substrate 101 is subjected to the roughing and finishing steps using the diamond wheel of a grinding machine (not shown). The grinding process is thus performed to cause the substrate 101 to have a predetermined thickness. Subsequently, the masking tape 137 is removed and washed.

Moreover, at the step of FIG. 16, the stress-application film 138 which contains silicon nitride ($Si_3N_4$) with a thickness of 1 micrometers is deposited on the back surface of the Si substrate 101 by the CVD process. Specifically, the thickness of the stress-application film 138 is set in a range of 500 nanometers to 5 micrometers. From the viewpoint of process time, it is desirable that the thickness of the stress-application film 138 is in a range of 0.5 micrometers to 2 micrometers. It is more desirable that it is in a range of 1 micrometers to 1.50 micrometers.

Moreover, the present invention is limited to the silicon nitride in the present embodiment. Alternatively, aluminium nitride (AlN), alumina ($Al_2O_3$), silicon carbide (SiC), etc. may be used instead.

The coefficient of thermal expansion of the stress-application film 138 of the present embodiment (containing $Si_3N_4$) is $3 \times 10^{-6}$ $K^{-1}$, and the coefficient of thermal expansion of the Si substrate 101 is $2.3 \times 10^{-6}$ $K^{-1}$. The substrate temperature rises by the substrate heating during the film deposition, and the substrate is cooled after the completion of the film deposition. Alternately, the substrate temperature may be raised by heating the substrate using lamp or resistive heater. Therefore, a thermal stress occurs on the back surface of the substrate 101 according to the difference in the coefficient of thermal expansion between the stress-application film 138 and the Si substrate 101.

In the cases of the alternative examples, the coefficients of thermal expansion of AlN, $Al_2O_3$, and SiC are $4.5 \times 10^{-6}$ $K^{-1}$, $6.8 \times 10^{-6}$ $K^{-1}$, and $5.5 \times 10^{-6}$ $K^{-1}$, respectively. Similarly, in these examples, a thermal stress occurs also on the back surface of the substrate 101.

Accordingly, the thermal stress on the back surface of the substrate 101 causes the tensile or compressive stress to be applied to the ferroelectric film 15 (or 113) of the ferroelectric capacitor 10 through the substrate 101. Therefore, according to the present embodiment, it is possible to suitably switch the direction of polarization and control the hysteresis characteristics of the ferroelectric capacitor in the FeRAM. Furthermore, even if stress is applied to the substrate of the present embodiment in the packaging process the characteristics of the ferroelectric capacitor can be held uniformly.

Thus, the stacked capacitor type FeRAM of the above-described embodiment shown in FIG. 12 can be produced according to the manufacturing method of the present invention.

Next, a description will be given of a modification of the second preferred embodiment of the invention.

The semiconductor device of this modification is the same as the second preferred embodiment except that the stress-application film is formed on the passivation film.

Figure 17:
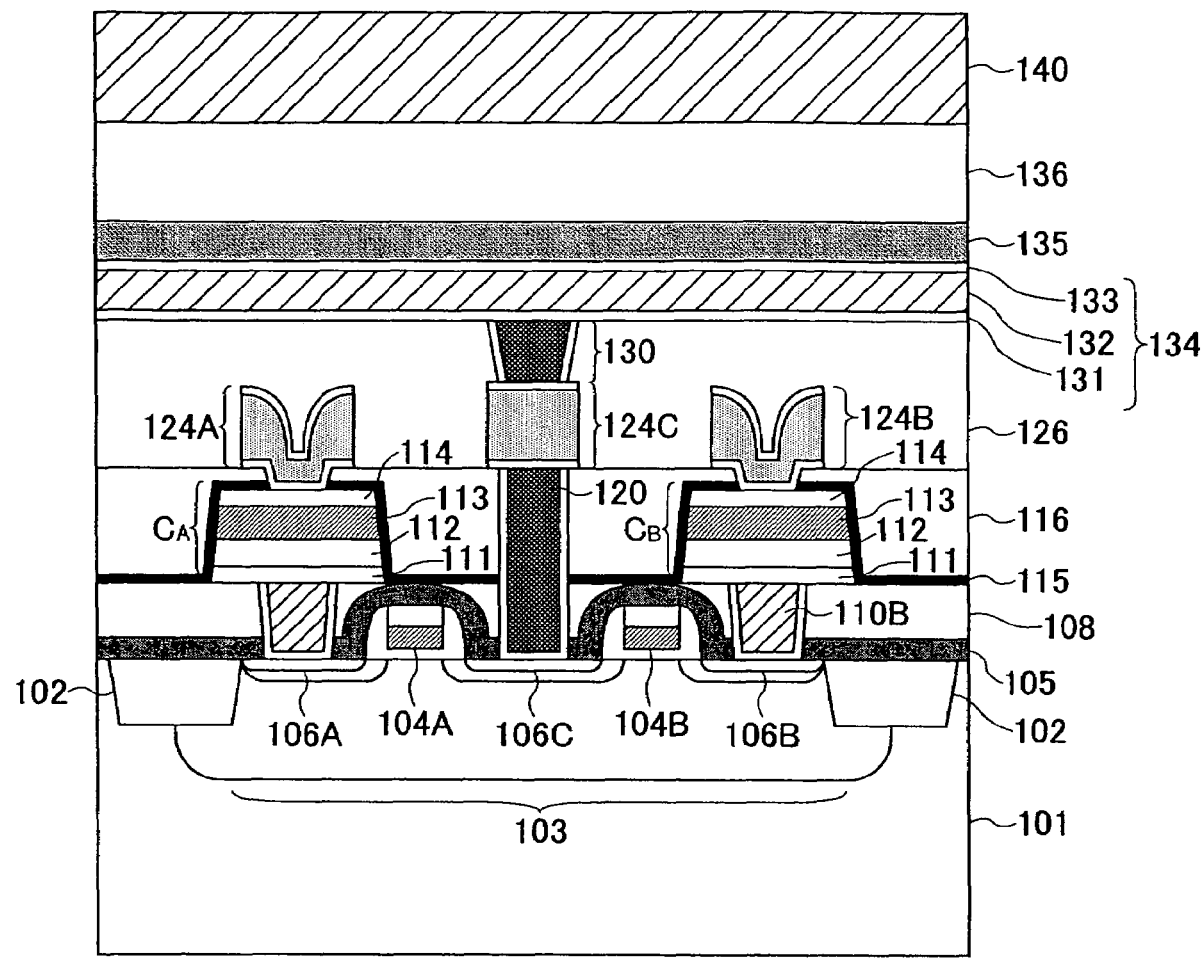
FIG. 17 is a cross-sectional view of a FeRAM of a modification of the second preferred embodiment.

FIG. 17 shows the composition of a stacked capacitor type FeRAM concerning the modification of the second preferred embodiment. In FIG. 17, the elements which are essentially the same as corresponding elements in FIG. 12 are designated by the same reference numerals, and a description thereof will be omitted.

As shown in FIG. 17, the FeRAM of this modification comprises: a semiconductor substrate 101; gate electrodes 104A and 104B and diffusion regions 106A and 106B which are formed on the semiconductor substrate 101; ferroelectric capacitors CA and CB which are formed on the semiconductor substrate 101 and connected with the diffusion regions 106A and 106B by the contact plugs 110A and 110B; interlayer dielectric films 116, 126 and 135 which cover the semiconductor substrate 101 and the ferroelectric capacitors CA and CB; a passivation film 136; and a stress-application film 140 which is formed on the passivation film 136.

The stress-application film 140 contains, for example, silicon nitride, and its thickness is set to be in a range of 0.5 micrometers to 2 micrometers.

The stress-application film 140 may employ the stress-application film 138 of the second preferred embodiment. The stress-application film 140 is able to apply tensile or compressive stress to the ferroelectric capacitors CA and CB provided on the bottom of the stress-application film 140.

Therefore, the direction of polarization of the ferroelectric capacitor of the FeRAM can be arranged, and the characteristics of the coercive force can be arranged. Furthermore, even if stress is applied to the substrate of this embodiment in the packaging process, the characteristics of the ferroelectric capacitor can be held uniformly.

Next, a description will be given of the third preferred embodiment of the invention.

Figure 18:
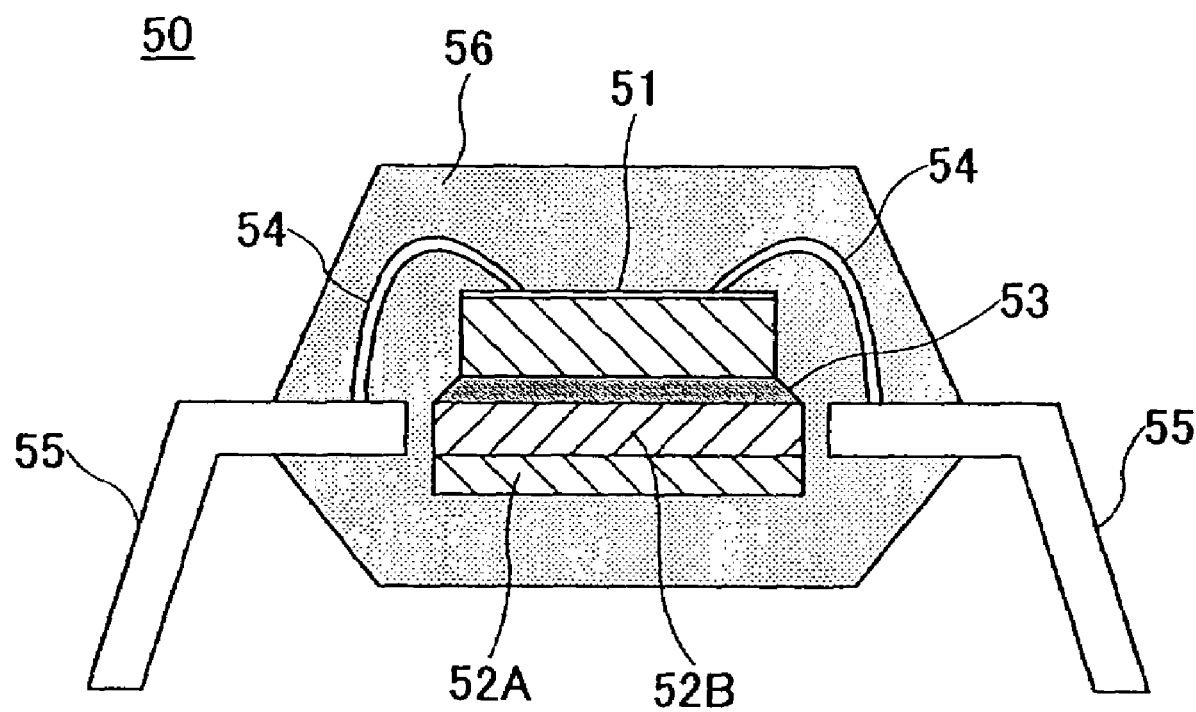
FIG. 18 is a cross-sectional view of a semiconductor device of a third preferred embodiment of the invention.

FIG. 18 shows the composition of a semiconductor device 50 of the third preferred embodiment of the invention.

As shown in FIG. 18, the semiconductor device 50 of this embodiment comprises an IC chip 51, die pads 52A and 52B which support the IC chip 51, a die attachment layer 53 which attaches the IC chip 51 to the die pads 52A and 52B, a wire 54, a lead 55, and a mold encapsulant 56 which encapsulates the IC chip 51 and the wire 54, etc.

On the IC-chip 51, the FeRAM of the second preferred embodiment or the modification of the second preferred embodiment is formed. However, the stress-application films 138 and 140, as in the FeRAM of the second preferred embodiment or the modification of the second preferred embodiment, may not be provided therein. As for the die attachment layer 53, a thermosetting resin, Au—Si, etc. can be used.

The die pads 52A and 52B are composed of a bimetallic strip containing metal materials with different coefficients of thermal expansion, for example, Invar alloy (40 atom % nickel-iron alloy) and Fe, or Koval alloy (Fe—Co—Ni alloy) and Cu, etc. Therefore, the die pads 52A and 52B of the present embodiment are provided to apply tensile or compressive stress to the IC chip 51 (i.e., the ferroelectric film).

Next, a description will be given of the die bonding process in the manufacture method of the semiconductor device of the present embodiment.

FIG. 19A, FIG. 19B and FIG. 19C are diagrams for explaining the manufacture method of the semiconductor device of the third preferred embodiment.

At the step of FIG. 19A, using the dispenser 58, a proper amount of the die attachment agent 59 is applied to the die pad 52.

Next, at the step of FIG. 19B, the IC chip 51 is placed on the die attachment agent 59, and using the collet 61, heat and pressure is applied to the IC chip 51 and the die attachment agent 59 from the above, so that the thermosetting resin of the die attachment agent 59 is stiffened. Under the circumstances, the heat from the collet 61 conducts to the die pads 52A and 52B, and the die pads 52A and 52B are heated. Since the die pads 52A and 52B are composed of the bimetal, the difference in the coefficient of thermal expansion causes the die pads 52A and 52B, to be curved upward, for example. Therefore, the stress is applied to the IC chip 51 so that the IC chip 51 is also curved upward.

Next, at the step of FIG. 19C, after the die attachment agent is hardened by heat, the heating of the collet 58 is canceled so that the die attachment layer 53 is cooled.

Subsequently, the electrodes of the IC chip 51 are connected to the lead 55 by the wire 54 through the wire bonding, and the IC chip 51 and the wire 54 are encapsulated by the mold encapsulant 56. Thus, the semiconductor device of the present embodiment shown in FIG. 18 is formed.

According to the above-described embodiment, stress is applied to the IC chip according to the deformation of the die pad. In the conventional die bonding process, great stress is applied to the IC chip. Therefore, in the conventional die bonding process, the hysteresis characteristic of the ferroelectric capacitor tend to be disturbed easily. However, according to the present embodiment, the predetermined stress is applied, and it is possible to suitably control the hysteresis characteristic of the ferroelectric capacitor and prevent the disturbance thereof.

Moreover, modification of the third preferred embodiment may be made so that the die pads are composed of a metal material, such as aluminum, and the die attachment layer is composed of a thermosetting resin with high elastic modulus, such as epoxy resin. For example, the elastic modulus of the material of the die attachment layer may be set to $2 \times 10^9$ MPa. The contraction of the die attachment agent with high elastic modulus in this modification at the time of curing can be made high, and tensile stress which acts to curve the IC chip upward is applied to the back surface of the IC chip, so that the tensile stress is applied to the ferroelectric film. Therefore, it is possible that the direction of polarization domains of the ferroelectric capacitor can be arranged.

According to the present invention, it is possible to provide a semiconductor device which enables the stabilization of operation such that the characteristics of each ferroelectric capacitor remain unchanged. Moreover, it is possible to provide a semiconductor device in which the ferroelectric capacitor is stable over an extended period of time. Furthermore, while applying stress to the ferroelectric film, the electric field can be applied, and it is possible to provide the fixture which can measure the electrical property of the ferroelectric film.

The present invention is not limited to the above-described embodiments, and variations and modifications may be made without departing from the scope of the present invention.

For example, a combination of the third preferred embodiment and the modification of the third preferred embodiment may be made. Furthermore, in the manufacturing process of the FeRAM, it is possible to apply a fixed stress to the ferroelectric film mechanically.

What is claimed is:

1. A semiconductor device comprising:
   an IC chip including a semiconductor substrate and a ferroelectric capacitor, the ferroelectric capacitor including a lower electrode layer, a ferroelectric film and an upper electrode layer which are stacked over the substrate sequentially;
   a die pad supporting the IC chip; and
   a die attachment layer attaching the IC chip to the die pad, wherein one of the die attachment layer and the die pad is provided to apply tensile or compressive stress to the IC chip.

2. The semiconductor device of claim 1 wherein the die attachment layer is composed of a thermosetting resin, and the thermosetting resin of the die attachment layer is contracted at a time of curing so that the die attachment layer acts to apply tensile stress to the ferroelectric film of the IC chip.

3. The semiconductor device of claim 1 wherein the die pad is composed of a bimetallic strip containing metal materials with different coefficients of thermal expansion, so that the die pad is provided to apply tensile or compressive stress to the ferroelectric film of the IC chip.

* * * * *